(12) United States Patent
Manning

(10) Patent No.: US 6,570,807 B2
(45) Date of Patent: May 27, 2003

(54) INTERMEDIATE BOOSTED ARRAY VOLTAGE

(75) Inventor: Troy Manning, Meridian, ID (US)

(73) Assignee: Micron Technology, Inc., Bosie, ID (US)

(*) Notice: Subject to any disclaimer, the term of this patent is extended or adjusted under 35 U.S.C. 154(b) by 0 days.

(21) Appl. No.: 09/934,969

(22) Filed: Aug. 22, 2001

(65) Prior Publication Data

US 2003/0039164 A1 Feb. 27, 2003

(51) Int. Cl.[7] ................................. G11C 7/00
(52) U.S. Cl. ........................... 365/226; 365/189.09
(58) Field of Search ........................... 365/226, 189.09, 365/207, 230.06; 327/536, 537

(56) References Cited

U.S. PATENT DOCUMENTS

| | | | |
|---|---|---|---|
| 5,023,465 A | | 6/1991 | Douglas et al. |
| 5,537,306 A | * | 7/1996 | Blodgett ............... 323/901 |
| 5,553,030 A | | 9/1996 | Tedrow et al. |
| 5,629,843 A | * | 5/1997 | Loughmiller et al. ...... 363/59 |
| 5,670,908 A | | 9/1997 | Kim et al. |
| 5,745,354 A | | 4/1998 | Raza |
| 5,781,473 A | * | 7/1998 | Javanifard et al. ...... 365/185.18 |
| 5,999,475 A | * | 12/1999 | Futatsuya et al. ...... 365/185.23 |
| 6,005,812 A | | 12/1999 | Mullarkey |
| 6,160,440 A | | 12/2000 | Javanifard et al. |
| 6,160,723 A | | 12/2000 | Liu |
| 6,184,594 B1 | | 2/2001 | Kushnarenko |

* cited by examiner

Primary Examiner—Michael S. Lebentritt
Assistant Examiner—Anh Phung
(74) Attorney, Agent, or Firm—Thorpe Reed & Armstrong LLP (57) ABSTRACT

Two voltage pumps, or a single voltage pump having two pump circuits, are given wherein one pump, or pump circuit, produces a normal pumped voltage and the other pump, or pump circuit, produces an intermediate pumped voltage which is less than the normal pumped voltage but still greater than the supply voltage. The intermediate pumped voltage may be used quite effectively for signals such as Bias, EQ, ISO, or at any other point on the die that needs a pumped voltage that is not as high as the voltage that the access devices require. The bus used to route the pumped voltage may be split to enable both the pumped voltage and the intermediate pumped voltage to be routed without requiring an additional bus or changes to existing masks. Methods of operating multiple voltage pumps and supplying a full pumped voltage and an intermediate pumped voltage are also given.

65 Claims, 3 Drawing Sheets

INTERMEDIATE BOOSTED ARRAY VOLTAGE

BACKGROUND

1. Field of the Invention

The present invention is directed to voltage pumps and, more particularly, to voltage pumps and methods of operating voltage pumps used in memory devices.

2. Description of the Background

Pump circuits are commonly used to create voltages that are more positive or more negative than available supply voltages. Two types of voltage pumps that are commonly used in memory devices, such as Dynamic Random Access Memories (DRAM), are a Vcc pump which generates a boosted word line voltage and a Vbb pump which generates a negative substrate bias voltage. The Vcc pump is built primarily from nMos transistors while the Vbb pump is built from pMos transistors.

Figure 1:
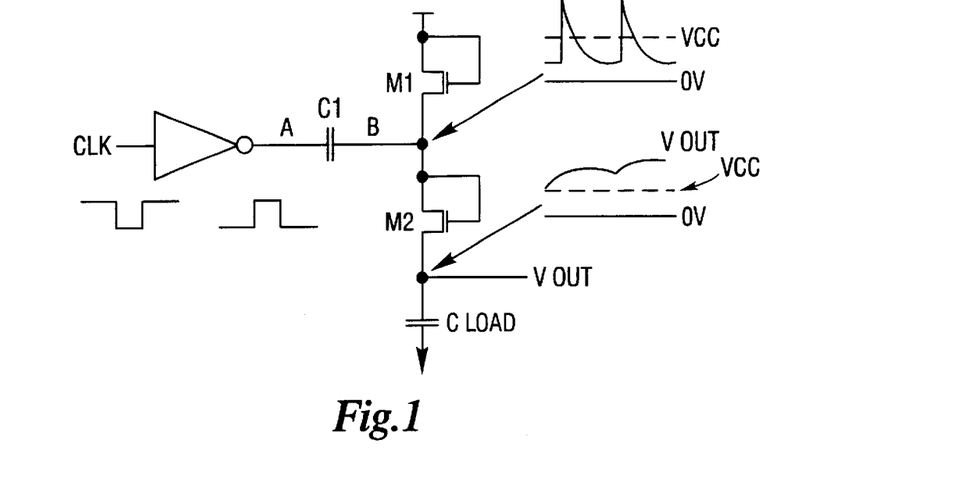
FIG. 1 is a circuit illustrating the operation of simple voltage pump.

The operation of a voltage pump will now be explained with reference to a simple voltage pump circuit illustrated in FIG. 1. For this positive voltage pump circuit, consider that for one phase of a pump cycle the clock signal CLK is high. During this phase, node A is at ground potential and node B is clamped to source voltage Vcc minus Vth, which is the voltage drop across transistor M1. The charge stored in capacitor C1 is given by the following equation:

$$Q1=C1(Vcc-Vth) \text{coulombs}$$

During the second phase, the clock CLK will transition low, which brings node A high. As node A rises to the source voltage Vcc, node B begins to rise above Vcc minus Vth, shutting off transistor M1. At the same time, as node B rises one Vth above Vload, transistor M2 begins to conduct. The charge from capacitor C1 is transferred through transistor M2 and shared with capacitor Cload. That action effectively pumps charge into the capacitor Cload and ultimately raises the output voltage Vout. During subsequent clock cycles, the voltage pump continues to deliver charge to the capacitor Cload until the voltage Vout equals the peak voltage occurring at node B. A simple negative voltage pump could be built from the circuit of FIG. 1 by substituting pMos transistors for the two nMos transistors shown and moving their respective gate connections.

As supply voltage drops, charge pump efficiency decreases dramatically. When supply voltage drops to approximately 1.8 volts, efficiency of the charge pumps drops to around 15 percent. That means it takes six mA of supply voltage (Vcc) current to supply one mA of pumped voltage (Vccp) current. Additionally, more array signals need to be boosted above the supply voltage to maintain desired array performance. Examples of signals which require boosting include the signal used to bias the bit lines (Bias), to equilibrate the sense amplifiers (EQ), and to isolate the sense amplifiers (ISO), which are signals well known to those of ordinary skill in the art.

For large parts, such as a memory having 256 megabits of storage, boosting all of those signals to Vccp approaches 8 mA of Iccp current, or 40 mA of Vcc current. That demand requires the use of much larger voltage pumps or more voltage pumps. Also, a wider bus is needed to carry the greater current demanded. Providing larger pumps or more pumps, as well as wider distribution buses, takes up valuable space. Additionally, different conditions place different demands on the boosted voltage Vccp. For example, during test modes, or refresh, there may be a much greater demand for the boosted voltage then during normal operation. Sizing voltage pumps to deliver the necessary increased voltage for these special situations results in inefficient operation of the voltage pump during normal operation. Accordingly, the need exists for a voltage pump which can deliver the necessary pumped voltages while at the same time maintaining a high degree of efficiency.

SUMMARY OF THE PRESENT INVENTION

The present invention solves the problems found in the prior art by providing two voltage pumps, or a single voltage pump having two pump circuits, with one pump or pump circuit having as its target value the normal pumped voltage Vccp and the other pump or pump circuit having as its target value an intermediate pumped voltage which is less than Vccp but still greater than the supply voltage Vcc. That intermediate pumped voltage may be referred to as Vcca.

With the intermediate pumped voltage Vcca at, for example, 0.8 volts above the supply voltage Vcc, or little more than an n-channel Vt above Vcc, the intermediate pumped voltage may be used quite effectively for Bias, EQ, ISO, or at any other point on the die that needs a pumped voltage, but not a pumped voltage as high as the 1.5–1.8 volts above Vcc that the access devices require. With the intermediate pumped voltage Vcca at about 0.8 volts above the supply voltage Vcc, pump efficiency returns to over 30 percent. By its very nature, less current is needed as the voltage delta is lower. On a part such as a 256 megabit design, an overall 10 percent of operating Vcc current will be saved. Additionally, fewer charge pumps will be needed. Bus size difference is very little, as the existing Vccp bus is cut into two buses at different potentials; one portion of the split bus being at the full pumped voltage Vccp while the other portion of the split bus is at the intermediate pumped voltage Vcca. Those advantages and benefits, and others, will become apparent from the Description of the Preferred Embodiments hereinbelow.

BRIEF DESCRIPTION OF THE DRAWINGS

For the present invention to be easily understood and readily practiced, the present invention will now be described, for purposes of illustration and not limitation, in conjunction with the following figures wherein.

DESCRIPTION OF THE PREFERRED EMBODIMENTS

The present invention is directed to two voltage pumps, or two voltage pump circuits within a single voltage pump, which are designed and operated at different target values. The particular design of the voltage pump, or pump circuits, is not an important feature of the present invention. Rather, it is the concept of operating one voltage pump or pump circuit at the full pumped value of, for example, 1.5 to 1.8 volts above a supply voltage Vcc, while the other pump or pump circuit is operated at an intermediate pumped voltage less than full Vccp. For example, the intermediate pumped voltage Vcca may be 0.8 volts above the supply voltage Vcc.

Figure 2:
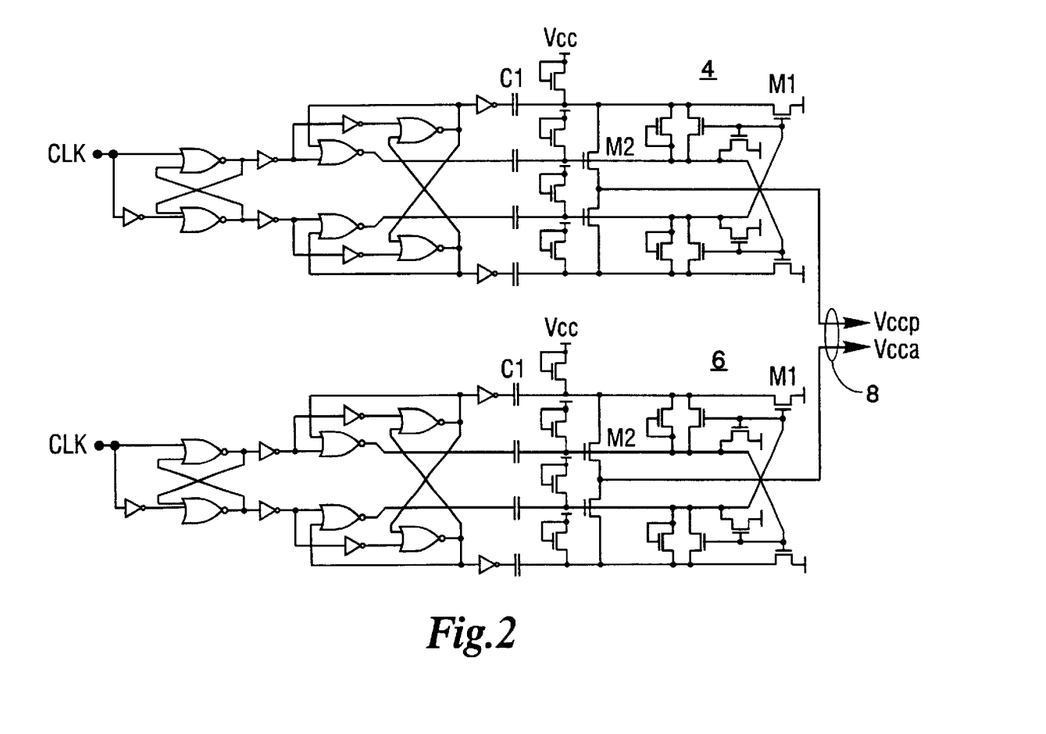
FIG. 2 is a schematic of two voltage pumps for providing two output voltages to a dual conductor bus.

One example of hardware which may be used to implement the present invention is illustrated in FIG. 2. The reader should recognize that FIG. 2 is merely one hardware design used to implement the concepts previously described such that the present invention is not limited to the disclosed hardware configuration. In FIG. 2, a pair of voltage pumps 4, 6 are illustrated. The voltage pumps 4, 6 are identical and are constructed of n-channel devices so as to implement the pump circuit schematically illustrated in FIG. 1. The voltage pump 4 may be constructed and operated to produce an output voltage Vccp which may be, for example, 1.5 to 1.8 volts above a supply voltage Vcc. The voltage pump 6 is identical in construction to the voltage pump 4 except the components are sized and the pump is operated at a target value which is less than the output voltage of the voltage pump 4. For example, the target value of the voltage pump 6 may be less than full Vccp, such as 0.8 volts above the supply voltage Vcc. The output voltage Vccp of the voltage pump 4 and the output voltage Vcca of the voltage pump 6 are carried by a dual conductor bus 8. The dual conductor bus will typically be the bus for the full pumped voltage Vccp, which is split so that a portion of the bus carries the full pumped voltage Vccp while the other portion of the bus carries the intermediate pumped voltage Vcca.

The voltage pump 6 may be sized so that it operates at maximum efficiency. By the addition of the voltage pump 6, the voltage pump 4 will also be able to operate at a higher efficiency than if the voltage pump 4 had to service all of the signals which the voltage pump 6 services. As a result, it is anticipated that in large devices less voltage pumps 4 will be needed, such that the reduced number of voltage pumps 4 will more than offset the addition of voltage pumps 6. For example, at about 0.8 volts above the supply voltage Vcc, pump efficiency returns to over 30 percent, and by its very nature less current is needed as the voltage delta is lower. On the 256 megabit part, described below, an overall 10 percent of operating supply source current Vcc will be saved. Additionally, fewer voltage pumps will be needed. The size of bus 8 is substantially the same as the existing bus for carrying the pumped voltage Vccp. The bus 8 is cut into two buses each operated at its own potential.

Figure 3:
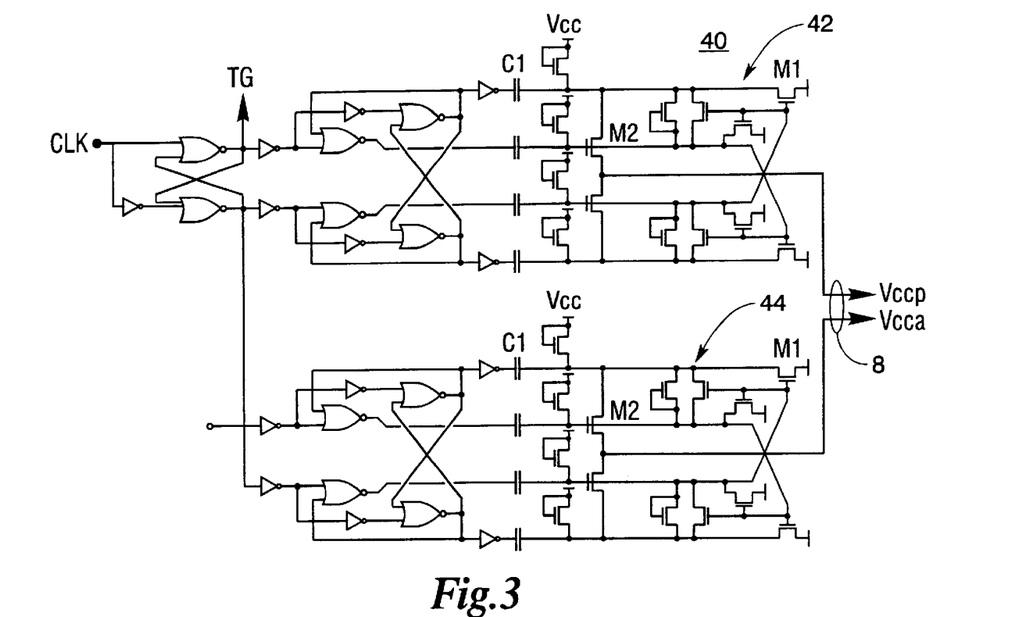
FIG. 3 is a schematic of a voltage pump having two pump circuits for providing two pumped voltages to a dual conductor bus.

Another example of a hardware design used to implement the present invention is illustrated in FIG. 3. In FIG. 3, a single voltage pump 40 has a first voltage pump circuit 42 producing a first pumped voltage Vccp and a second voltage pump circuit 44 producing a second pumped voltage Vcca intermediate the supply voltage Vcc and the first pumped voltage Vccp. The pump circuits 42, 44 are similar to pumps 4, 6, except that the pump circuits 42, 44 share some common gates. Otherwise, the operation of pump circuits 42, 44 is the same as previously discussed.

Other pump designs such as those found in U.S. Pat. Nos. 6,160,723, 5,553,030, 5,670,908 and 6,160,440, to name just a few, may also be used. The aforementioned patents are hereby incorporated by reference. Circuits other than voltage pumps may be used to generate the two voltages necessary for operating the array.

Figure 4:
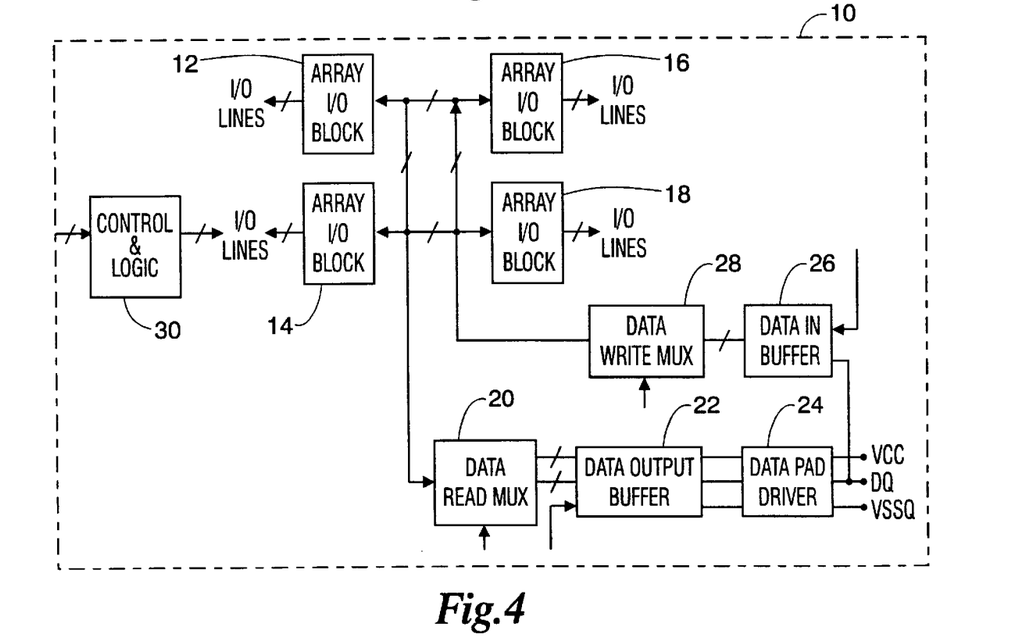
FIG. 4 is a block diagram of a 256 megabit memory device with which the present invention may be used.

An example of a memory device with which the present invention may be used is illustrated in FIG. 4. FIG. 4 is a block diagram of a 256 megabit memory device. The device illustrated in FIG. 4 is merely an exemplary device to illustrate how the present invention may be used in a memory device. The present invention is not limited to the particular memory device illustrated in FIG. 4. The 256 meg memory device 10 is constructed of four 64 meg array quadrants (not shown in FIG. 4) which are serviced by array blocks 12, 14, 16 and 18. A data read path from the array I/O blocks 12, 14, 16 and 18 to an input/output pad DQ includes a data read mux 20, a data output buffer 22 responsive to the data read mux 20, and a data pad driver 24 responsive to the data output buffer 22. A data write path from the input/output pad DQ to the array I/O blocks 12, 14, 16 and 18 includes a data in buffer 26 and a data write muliplexer 28 responsive to the data in buffer 26 for inputting data to the array I/O blocks 12, 14, 16 and 18. Finally, control and logic circuits 30 are provided for receiving external control signals which define read and write operations, for receiving address information for identifying where read and write operations are to occur and for producing control signals for controlling the various devices illustrated in FIG. 4. The components of FIG. 4 may be considered to be one example of peripheral devices.

Figure 5:
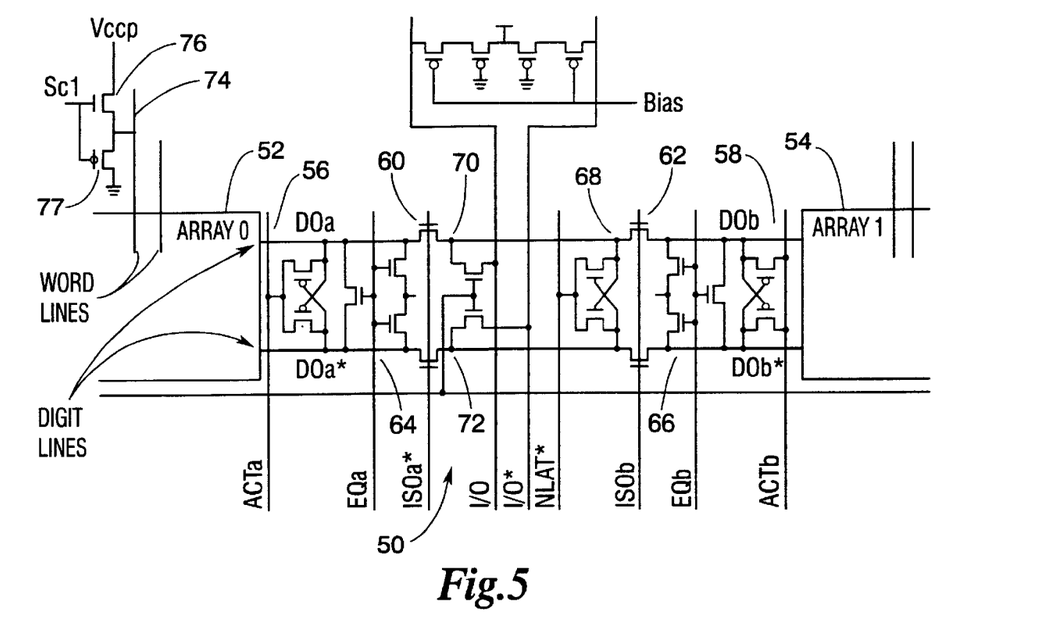
FIG. 5 is an electrical schematic of one type of sense amp block which may be used to service an array of memory cells.

FIG. 5 is an electrical schematic of one type of sense amplifier block 50 servicing two arrays 52, 54 of memory cells. The sense amplifier block 50 includes two p-sense amplifiers 56, 58 outside a pair of isolation transistors 60, 62, respectively. The sense amplifier block 50 also includes a pair of EQ/bias devices 64, 66, a single n-sense amplifier 68, and a single I/O transistor 70, 72 for each digitline.

Each of the arrays 52, 54 has wordlines running therethrough. One of the wordlines 74 is illustrated in conjunction with an n-type and a p-type transistor 76, 77, respectively. The transistors 76 and 77 are responsive to a select signal to connect the wordline 74 to either the pumped voltage Vccp or ground. Other transistors connected across the I/O line and I/O* line are responsive to the Bias signal to bias those lines. The sense amplifier block 50 as well as the transistors used to bias the wordlines and I/O lines are known in the art. Other types of sense amplifier blocks and other designs for biasing the wordlines and I/O lines may be utilized. FIG. 5 is illustrative of how the pumped voltage Vccp and how the intermediate pumped voltage Vcca may be used with a memory device. Other circuit designs will result in the pumped voltages being used in other ways.

The sense amplifier block 50 of FIG. 5 cooperates with the peripheral devices of FIG. 4 to provide an example of how information may be written into and read from the arrays 52, 54 illustrated in FIG. 5.

The present invention is also directed to a number of methods. For example, FIG. 5 illustrates a method of supplying a first pumped voltage to a plurality of wordlines and supplying a second pumped voltage that is less than the first pumped voltage to one of the plurality of sense amplifiers and I/O lines. The first pumped voltage may be greater than the supply voltage while the second pumped voltage may be intermediate the supply voltage and the first pumped voltage.

FIG. 2 illustrates a method of operating a first voltage pump to provide a first output voltage greater than a supply voltage for biasing the wordlines of a memory device and operating a second voltage pump to provide a second output voltage intermediate the supply voltage and the first output voltage for biasing one of the plurality of sense amplifiers and the I/O lines of a memory device.

FIG. 3 illustrates a method of operating a voltage pump having two pump circuits. The first voltage pump circuit is operated to provide a first pumped voltage greater than a supply voltage for biasing the wordlines of a memory device while the second voltage pump circuit is operated to provide a second pumped voltage intermediate the supply voltage and the first pumped voltage for biasing one of a plurality of sense amplifiers and the I/O lines of a memory device.

The present invention is also directed to an apparatus and a method of operating an array of a memory device using two voltages, both of which are great than Vcc.

Figure 6:
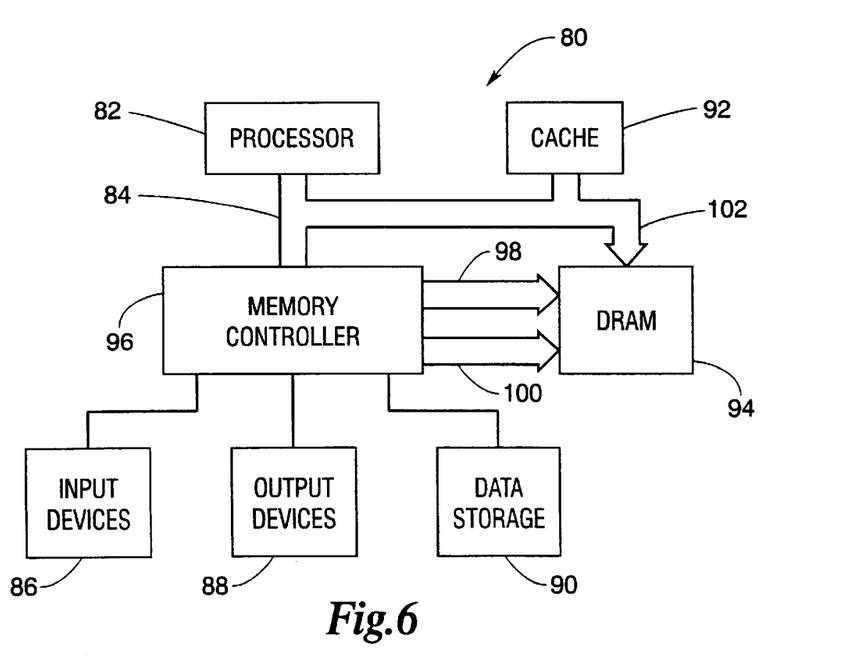
FIG. 6 is a block diagram of a system in which the memory device of FIG. 4 may be used.

The memory device illustrated in FIG. 4 may be used in a system 80 as illustrated in FIG. 6. The computer system 80 includes a processor 82 for performing various computing functions, such as executing specific software to perform specific calculations or tasks. The processor 82 includes a processor bus 84 that normally includes an address bus, a control bus, and a data bus. In addition, the computer system 80 includes one or more input devices 86, such as a keyboard or a mouse, coupled to the processor 82 to allow an operator to interface with the computer system 80. Typically, the computer system 80 also includes one or more output devices 88 coupled to the processor 82, such output devices typically being a printer or a video terminal. One or more data storage devices 90 are also typically coupled to the processor 82 to allow the processor 82 to store data in or retrieve data from internal or external storage media (not shown). Examples of typical storage devices 90 include hard and floppy disks, tape cassettes, and compact disk read-only memories (CD-ROMs). The processor 82 is also typically coupled to cache memory 92, which is usually static random access memory ("SRAM") and to the DRAM 94 through a memory controller 96. The memory controller 96 normally includes a control bus 98 and an address bus 100 that are coupled to the DRAM 94. A data bus 102 may be coupled to the processor bus 84 either directly (as shown), through the memory controller 96, or by some other means.

While the present invention has been described in conjunction with preferred embodiments thereof, those of ordinary skill in the art will recognize that many modifications and variations may be made. The foregoing description and the following claims are intended to cover all such modifications and variations.

What is claimed is:

1. A combination, comprising:
   a first voltage pump for producing a first output voltage;
   a second voltage pump for producing a second output voltage different than said first output voltage, wherein said second output voltage is produced independent of said first output voltage; and
   a dual conductor bus for delivering both said first and said second output voltages.

2. A combination, comprising:
   a first voltage pump for producing a first output voltage greater than a supply voltage;
   a second voltage pump for producing a second output voltage intermediate said first output voltage and the supply voltage, wherein said second output voltage is produced independent of said first output voltage; and
   a dual conductor bus for delivering both said first and second output voltages.

3. The combination of claim 2 wherein said first voltage pump produces a first output voltage approximately 1.5–1.8 volts above the supply voltage, and wherein said second voltage pump produces a second output voltage approximately 0.8 volts above the supply voltage.

4. A voltage pump, comprising:
   a first voltage pump circuit for producing a first pumped voltage;
   a second voltage pump circuit for producing a second pumped voltage different than said first pumped voltage, wherein said second output voltage is produced independent of said first output voltage; and
   a dual conductor bus for delivering both said first and said second pumped voltages.

5. A voltage pump, comprising:
   a first voltage pump circuit for producing a first pumped voltage greater than a supply voltage;
   a second voltage pump circuit for producing a second pumped voltage intermediate the supply voltage and said first pumped voltage, wherein said second output voltage is produced independent of said first output voltage; and
   a dual conductor bus for delivering both said first and said second pumped voltages.

6. The voltage pump of claim 5 wherein said first voltage pump circuit produces a first pumped voltage approximately 1.5–1.8 volts above the supply voltage, and wherein said second voltage pump circuit produces a second pumped voltage approximately 0.8 volts above the supply voltage.

7. A combination, comprising:
   an array of memory cells having a plurality of wordlines and digitlines running therethrough;
   a plurality of input/output lines;
   a plurality of sense amplifiers for transferring data between said digitlines and said input/output lines;
   a first voltage pump for producing a first output voltage;
   a second voltage pump for producing a second output voltage different than said first output voltage; and
   a dual conductor bus for delivering said first output voltage to said wordlines and said second output voltage to one of said plurality of sense amplifiers and said input/output lines.

8. The combination of claim 7 wherein said second output voltage is delivered to said plurality of sense amplifiers to boost one of an isolation signal and an equilibration signal.

9. The combination of claim 7 wherein said first voltage pump produces an output voltage approximately 1.5–1.8 volts above a supply voltage and wherein said second voltage pump produces an output voltage approximately 0.8 volts above the supply voltage.

10. A combination, comprising:
    an array of memory cells having a plurality of wordlines and digitlines running therethrough;
    a plurality of input/output lines;
    a plurality of sense amplifiers for transferring data between said digitlines and said input/output lines;
    a first voltage pump for producing a first output voltage greater than a supply voltage;
    a second voltage pump for producing a second output voltage intermediate said first output voltage and the supply voltage; and
    a dual conductor bus for delivering said first output voltage to said wordlines and said second output voltage to one of said plurality of sense amplifiers and said input/output lines.

11. The combination of claim 10 wherein said second output voltage is delivered to said plurality of sense amplifiers to boost one of an isolation signal and an equilibration signal.

12. The combination of claim 10 wherein said first voltage pump produces an output voltage approximately 1.5–1.8 volts above a supply voltage and wherein said second voltage pump produces an output voltage approximately 0.8 volts above the supply voltage.

13. A combination, comprising:
an array of memory cells having a plurality of wordlines and digitlines running therethrough;
a plurality of input/output lines;
a plurality of sense amplifiers for transferring data between said digitlines and said input/output lines;
a first voltage pump circuit for producing a first pumped voltage;
a second voltage pump circuit for producing a second pumped voltage different than said first pumped voltage; and
a dual conductor bus for delivering said first pumped voltage to said wordlines and said second pumped voltage to one of said plurality of sense amplifiers and said input/output lines.

14. The combination of claim 13 wherein said second pumped voltage is delivered to said plurality of sense amplifiers to boost one of an isolation signal and an equilibration signal.

15. The combination of claim 13 wherein said first voltage pump circuit produces a pumped voltage approximately 1.5–1.8 volts above a supply voltage and wherein said second voltage pump circuit produces a pumped voltage approximately 0.8 volts above the supply voltage.

16. A combination, comprising:
an array of memory cells having a plurality of wordlines and digitlines running therethrough;
a plurality of input/output lines;
a plurality of sense amplifiers for transferring data between said digitlines and said input/output lines;
a first voltage pump circuit producing a first pumped voltage greater than a supply voltage;
a second voltage pump circuit producing a second pumped voltage intermediate said first pumped voltage and the supply voltage; and
a dual conductor bus for delivering said first pumped voltage to said wordlines and said second pumped voltage to one of said plurality of sense amplifiers and said input/output lines.

17. The combination of claim 16 wherein said second pumped voltage is delivered to said plurality of sense amplifiers to boost one of an isolation signal and an equilibration signal.

18. The combination of claim 16 wherein said first voltage pump circuit produces a pumped voltage approximately 1.5–1.8 volts above a supply voltage and wherein said second voltage pump circuit produces a pumped voltage approximately 0.8 volts above the supply voltage.

19. A memory device, comprising:
an array of memory cells having a plurality of wordlines and digitlines running therethrough;
a plurality of input/output lines;
a plurality of sense amplifiers for transferring data between said digitlines and said input/output lines;
a plurality of peripheral devices for cooperating with said plurality of sense amplifiers to write information into and read information out of said array;
a first voltage pump for producing a first output voltage;
a second voltage pump for producing a second output voltage different than said first output voltage; and
a split bus for delivering said first output voltage to said wordlines and said second output voltage to one of said plurality of sense amplifiers and said input/output lines.

20. The memory device of claim 19 wherein said second output voltage is delivered to said plurality of sense amplifiers to boost one of an isolation signal and an equilibration signal.

21. The memory device of claim 19 wherein said first voltage pump produces an output voltage approximately 1.5–1.8 volts above a supply voltage and wherein said second voltage pump produces an output voltage approximately 0.8 volts above the supply voltage.

22. A memory device, comprising:
an array of memory cells having a plurality of wordlines and digitlines running therethrough;
a plurality of input/output lines;
a plurality of sense amplifiers for transferring data between said digitlines and said input/output lines;
a plurality of peripheral devices for cooperating with said plurality of sense amplifiers to write information into and read information out of said array;
a first voltage pump for producing a first output voltage greater than a supply voltage;
a second voltage pump for producing a second output voltage intermediate said first output voltage and the supply voltage; and
a split bus for delivering said first output voltage to said wordlines and said second output voltage to one of said plurality of sense amplifiers and said input/output lines.

23. The memory device of claim 22 wherein said second output voltage is delivered to said plurality of sense amplifiers to boost one of an isolation signal and an equilibration signal.

24. The memory device of claim 22 wherein said first voltage pump produces an output voltage approximately 1.5–1.8 volts above a supply voltage and wherein said second voltage pump produces an output voltage approximately 0.8 volts above the supply voltage.

25. A memory device, comprising:
an array of memory cells having a plurality of wordlines and digitlines running therethrough;
a plurality of input/output lines;
a plurality of sense amplifiers for transferring data between said digitlines and said input/output lines;
a plurality of peripheral devices for cooperating with said plurality of sense amplifiers to write information into and read information out of said array;
a first voltage pump circuit for producing a first pumped voltage;
a second voltage pump circuit for producing a second pumped voltage different than said first pumped voltage; and
a split bus for delivering said first pumped voltage to said wordlines and said second pumped voltage to one of said plurality of sense amplifiers and said input/output lines.

26. The memory device of claim 25 wherein said second pumped voltage is delivered to said plurality of sense amplifiers to boost one of an isolation signal and an equilibration signal.

27. The memory device of claim 25 wherein said first voltage pump circuit produces a pumped voltage approximately 1.5–1.8 volts above a supply voltage and wherein said second voltage pump circuit produces a pumped voltage approximately 0.8 volts above the supply voltage.

28. A memory device, comprising:
an array of memory cells having a plurality of wordlines and digitlines running therethrough;

a plurality of input/output lines;

a plurality of sense amplifiers for transferring data between said digitlines and said input/output lines;

a plurality of peripheral devices for cooperating with said plurality of sense amplifiers to write information into and read information out of said array;

a first voltage pump circuit producing a first pumped voltage greater than a supply voltage;

a second voltage pump circuit producing a second pumped voltage intermediate said first pumped voltage and the supply voltage; and a split bus for delivering said first pumped voltage to said wordlines and said second pumped voltage to one of said plurality of sense amplifiers and said input/output lines.

29. The memory device of claim 28 wherein said second pumped voltage is delivered to said plurality of sense amplifiers to boost one of an isolation signal and an equilibration signal.

30. The memory device of claim 28 wherein said first voltage pump circuit produces a pumped voltage approximately 1.5–1.8 volts above a supply voltage and wherein said second voltage pump circuit produces a pumped voltage approximately 0.8 volts above the supply voltage.

31. A system, comprising:

a processor;

a bus coupled to said processor;

an input device in communication with said processor;

an output device in communication with said processor; and a memory device coupled to said processor through said bus, said memory device comprising:

an array of memory cells having a plurality of wordlines and digitlines running therethrough;

a plurality of input/output lines;

a plurality of sense amplifiers for transferring data between said digitlines and said input/output lines;

a plurality of peripheral devices for cooperating with said plurality of sense amplifiers to write information into and read information out of said array;

a first voltage pump for producing a first output voltage;

a second voltage pump for producing a second output voltage different than said first output voltage; and a split bus for delivering said first output voltage to said wordlines and said second output voltage to one of said plurality of sense amplifiers and said input/output lines.

32. The system of claim 31 wherein said second output voltage is delivered to said plurality of sense amplifiers to boost one of an isolation signal and an equilibration signal.

33. The system of claim 31 wherein said first voltage pump produces an output voltage approximately 1.5–1.8 volts above a supply voltage and wherein said second voltage pump produces an output voltage approximately 0.8 volts above the supply voltage.

34. A system, comprising:

a processor;

a bus coupled to said processor;

an input device in communication with said processor;

an output device in communication with said processor; and a memory device coupled to said processor through said bus, said memory device comprising:

an array of memory cells having a plurality of wordlines and digitlines running therethrough;

a plurality of input/output lines;

a plurality of sense amplifiers for transferring data between said digitlines and said input/output lines;

a plurality of peripheral devices for cooperating with said plurality of sense amplifiers to write information into and read information out of said array;

a first voltage pump for producing a first output voltage greater than a supply voltage;

a second voltage pump for producing a second output voltage intermediate said first output voltage and the supply voltage; and a split bus for delivering said first output voltage to said wordlines and said second output voltage to one of said plurality of sense amplifiers and said input/output lines.

35. The system of claim 34 wherein said second output voltage is delivered to said plurality of sense amplifiers to boost one of an isolation signal and an equilibration signal.

36. The system of claim 34 wherein said first voltage pump produces an output voltage approximately 1.5–1.8 volts above a supply voltage and wherein said second voltage pump produces an output voltage approximately 0.8 volts above the supply voltage.

37. A system, comprising:

a processor;

a bus coupled to said processor;

an input device in communication with said processor;

an output device in communication with said processor; and a memory device coupled to said processor through said bus, said memory device comprising:

an array of memory cells having a plurality of wordlines and digitlines running therethrough;

a plurality of input/output lines;

a plurality of sense amplifiers for transferring data between said digitlines and said input/output lines;

a plurality of peripheral devices for cooperating with said plurality of sense amplifiers to write information into and read information out of said array;

a first voltage pump circuit for producing a first pumped voltage;

a second voltage pump circuit for producing a second pumped voltage different than said first pumped voltage; and a split bus for delivering said first pumped voltage to said wordlines and said second pumped voltage to one of said plurality of sense amplifiers and said input/output lines.

38. The system of claim 37 wherein said second pumped voltage is delivered to said plurality of sense amplifiers to boost one of an isolation signal and an equilibration signal.

39. The system of claim 37 wherein said first voltage pump circuit produces a pumped voltage approximately 1.5–1.8 volts above a supply voltage and wherein said second voltage pump circuit produces a pumped voltage approximately 0.8 volts above the supply voltage.

40. A system, comprising:

a processor;

a bus coupled to said processor;

an input device in communication with said processor;

an output device in communication with said processor; and a memory device coupled to said processor through said bus, said memory device comprising:

an array of memory cells having a plurality of wordlines and digitlines running therethrough;

a plurality of input/output lines;

a plurality of sense amplifiers for transferring data between said digitlines and said input/output lines;

a plurality of peripheral devices for cooperating with said plurality of sense amplifiers to write information into and read information out of said array;

a first voltage pump circuit producing a first pumped voltage greater than a supply voltage;

a second voltage pump circuit producing a second pumped voltage intermediate said first pumped voltage and the supply voltage; and a split bus for delivering said first pumped voltage to said wordlines and said second pumped voltage to one of said plurality of sense amplifiers and said input/output lines.

41. The system of claim 40 wherein said second pumped voltage is delivered to said plurality of sense amplifiers to boost one of an isolation signal and an equilibration signal.

42. The system of claim 40 wherein said first voltage pump circuit produces a pumped voltage approximately 1.5–1.8 volts above a supply voltage and wherein said second voltage pump circuit produces a pumped voltage approximately 0.8 volts above the supply voltage.

43. A method, comprising:

supplying a first pumped voltage to a plurality of wordlines; and supplying a second pumped voltage that is less than said first pumped voltage to one of a plurality of sense amplifiers and input/output lines.

44. The method of claim 43 wherein said step of supplying a second pumped voltage includes the step of supplying said second pumped voltage to one of an isolation signal and an equilibration signal.

45. A method, comprising:

supplying a first pumped voltage greater than a supply voltage to a plurality of wordlines; and supplying a second pumped voltage that is intermediate said supply voltage and said first pumped voltage to one of a plurality of sense amplifiers and input/output lines.

46. The method of claim 45 wherein said step of supplying a second pumped voltage includes the step of supplying said second pumped voltage to one of an isolation signal and an equilibration signal.

47. A method, comprising:

operating a first voltage pump to provide a first output voltage greater than a supply voltage for biasing the wordlines of a memory device; and operating a second voltage pump to provide a second output voltage intermediate said supply voltage and said first output voltage for biasing one of a plurality of sense amplifiers and input/output lines of the memory device.

48. The method of claim 47 wherein said step of supplying a second output voltage includes the step of supplying said second output voltage to one of an isolation signal and an equilibration signal.

49. A method, comprising:

operating a first voltage pump to provide a first output voltage greater than a supply voltage for biasing the wordlines of a memory device; and operating a second voltage pump to provide a second output voltage less than said first output voltage for biasing one of a plurality of sense amplifiers and input/output lines of the memory device.

50. The method of claim 49 wherein said step of supplying a second output voltage includes the step of supplying said second output voltage to one of an isolation signal and an equilibration signal.

51. A method of operating a voltage pump, comprising:

operating a first voltage pump circuit to provide a first pumped voltage greater than a supply voltage for biasing the wordlines of a memory device; and operating a second voltage pump circuit to provide a second pumped voltage intermediate said supply voltage and said first pumped voltage for biasing one of a plurality of sense amplifiers and input/output lines of the memory device.

52. The method of claim 51 wherein said step of supplying a second pumped voltage includes the step of supplying said second pumped voltage to one of an isolation signal and an equilibration signal.

53. A method of operating a voltage pump, comprising:

operating a first voltage pump circuit to provide a first pumped voltage for biasing the wordlines of a memory device; and operating a second voltage pump circuit to provide a second pumped voltage less than said first pumped voltage for biasing one of a plurality of sense amplifiers and input/output lines of the memory device.

54. The method of claim 53 wherein said step of supplying a second pumped voltage includes the step of supplying said second pumped voltage to one of an isolation signal and an equilibration signal.

55. A combination, comprising:

an array of memory cells having a plurality of wordlines and digitlines running therethrough;

a plurality of input/output lines;

a plurality of sense amplifiers for transferring data between said digitlines and said input/output lines;

a first circuit for producing a first output voltage greater than a supply voltage;

a second circuit for producing a second output voltage intermediate said first output voltage and the supply voltage; and a dual conductor bus for delivering said first output voltage to said wordlines and said second output voltage to one of said plurality of sense amplifiers and said input/output lines.

56. The combination of claim 55 wherein said second output voltage is delivered to said plurality of sense amplifiers to boost one of an isolation signal and an equilibration signal.

57. The combination of claim 55 wherein said first circuit produces an output voltage approximately 1.5–1.8 volts above a supply voltage and wherein said second circuit produces an output voltage approximately 0.8 volts above the supply voltage.

58. A memory device, comprising:

an array of memory cells having a plurality of wordlines and digitlines running therethrough;

a plurality of input/output lines;

a plurality of sense amplifiers for transferring data between said digitlines and said input/output lines;

a plurality of peripheral devices for cooperating with said plurality of sense amplifiers to write information into and read information out of said array;

a first circuit for producing a first output voltage greater than a supply voltage;

a second circuit for producing a second output voltage intermediate said first output voltage and the supply voltage; and a split bus for delivering said first output voltage to said wordlines and said second output voltage to one of said plurality of sense amplifiers and said input/output lines.

59. The memory device of claim 58 wherein said second output voltage is delivered to said plurality of sense amplifiers to boost one of an isolation signal and an equilibration signal.

60. The memory device of claim 58 wherein said first circuit produces an output voltage approximately 1.5–1.8 volts above a supply voltage and wherein said second circuit produces an output voltage approximately 0.8 volts above the supply voltage.

61. A system, comprising:

a processor;

a bus coupled to said processor;

an input device in communication with said processor;

an output device in communication with said processor; and a memory device coupled to said processor through said bus, said memory device comprising:

an array of memory cells having a plurality of wordlines and digitlines running therethrough;

a plurality of input/output lines;

a plurality of sense amplifiers for transferring data between said digitlines and said input/output lines;

a plurality of peripheral devices for cooperating with said plurality of sense amplifiers to write information into and read information out of said array;

a first circuit for producing a first output voltage greater than a supply voltage;

a second circuit for producing a second output voltage intermediate said first output voltage and the supply voltage; and a split bus for delivering said first output voltage to said wordlines and said second output voltage to one of said plurality of sense amplifiers and said input/output lines.

62. The system of claim 61 wherein said second output voltage is delivered to said plurality of sense amplifiers to boost one of an isolation signal and an equilibration signal.

63. The system of claim 61 wherein said first circuit produces an output voltage approximately 1.5–1.8 volts above a supply voltage and wherein said second circuit produces an output voltage approximately 0.8 volts above the supply voltage.

64. A method, comprising:

supplying a first voltage greater than a supply voltage to a plurality of wordlines; and supplying a second voltage that is intermediate said supply voltage and said first voltage to one of a plurality of sense amplifiers and input/output lines.

65. The method of claim 64 wherein said step of supplying a second voltage includes the step of supplying said second voltage to one of an isolation signal and an equilibration signal.

* * * * *

UNITED STATES PATENT AND TRADEMARK OFFICE
CERTIFICATE OF CORRECTION

PATENT NO.      : 6,570,807 B2
DATED           : May 27, 2003
INVENTOR(S)     : Troy Manning It is certified that error appears in the above-identified patent and that said Letters Patent is hereby corrected as shown below:

Column 2,
Line 2, delete "then" and insert therefor -- than --.

Column 5,
Line 9, delete "great" and insert therefor -- greater --.

Signed and Sealed this

Twenty-eighth Day of October, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,570,807 B2 Page 1 of 1
DATED : May 27, 2003
INVENTOR(S) : Troy Manning It is certified that error appears in the above-identified patent and that said Letters Patent is hereby corrected as shown below:

Title page,
Item [73], Assignee, delete "Bosie" and insert -- Boise --

Signed and Sealed this

First Day of February, 2005

JON W. DUDAS
*Director of the United States Patent and Trademark Office*